(12) United States Patent
Ueda

(10) Patent No.: US 8,395,457 B2
(45) Date of Patent: Mar. 12, 2013

(54) PULSE WIDTH MODULATION SIGNAL GENERATOR AND METHOD

(75) Inventor: Yasuo Ueda, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 13/043,712

(22) Filed: Mar. 9, 2011

(65) Prior Publication Data
US 2011/0221541 A1   Sep. 15, 2011

(30) Foreign Application Priority Data
Mar. 15, 2010   (JP) .................................. 2010-056918

(51) Int. Cl.
*H03K 7/08*   (2006.01)
(52) U.S. Cl. ......................................... 332/109; 332/107
(58) Field of Classification Search .......... 332/109–111, 332/107; 327/172–177; 363/21.1, 21.18, 363/26, 41; 375/238
See application file for complete search history.

(56) References Cited

U.S. PATENT DOCUMENTS

| | | | | |
|---|---|---|---|---|
| 5,142,217 A * | 8/1992 | Gontowski, Jr. | .............. | 323/272 |
| 7,639,055 B2 * | 12/2009 | Kato et al. | ..................... | 327/172 |
| 2010/0219891 A1 * | 9/2010 | Tsuchiya | ...................... | 330/251 |

FOREIGN PATENT DOCUMENTS

JP   2003-110412   4/2003

* cited by examiner

*Primary Examiner* — Ryan Johnson
(74) *Attorney, Agent, or Firm* — Cooper & Dunham LLP

(57) ABSTRACT

A triangular wave generator in a pulse width modulation signal generator to generate a triangular wave signal and a pair of pulse signals. The first pulse signal is pulsed for a given duration of time when the triangular wave signal reaches a minimum limit thereof. The second pulse signal is pulsed for a given duration of time when the triangular wave signal reaches a maximum limit thereof. The voltage comparator generates a first pulse width modulation signal by comparing the triangular wave signal with an externally supplied direct current signal. The wave shaping circuit generates a second pulse width modulation signal by removing chattering components occurring immediately after rising and falling edges of the first pulse width modulation signal with a masking signal generated based on the first and second pulse signals and the first pulse width modulation signal.

10 Claims, 3 Drawing Sheets

PULSE WIDTH MODULATION SIGNAL GENERATOR AND METHOD

TECHNICAL FIELD

The present disclosure relates to a pulse width modulation (PWM) signal generator and method, and more particularly, to a PWM signal generator and method that can generate a PWM signal without chattering due to switching noise.

BACKGROUND ART

Pulse width modulation (PWM) signaling is used in various electrical appliances to control driver circuitry for direct current (DC) motors. One problem encountered by a PWM signal generator is that the circuit is susceptible to switching noise generated by a switching controller in load circuitry, which creates undesired, extra pulses at the leading and trailing edges of the resulting PWM signal (known in the art as "chattering"), leading to unexpected or undesired operation of the PWM-controlled electrical circuit.

To counteract this problem, various techniques have been proposed to provide a noise-free, chatter-free PWM signal generator. For example, one conventional PWM signal generator includes a wave shaping circuit formed of a combinational logic circuit containing a feedback loop that feeds back an output signal to obtain a desired PMW signal without chattering.

The conventional PWM circuit described above, however, has several drawbacks. One drawback is that, since the output signal fed back to the wave shaping circuit has no initial value specified, the feedback loop can cause unexpected errors in other circuits connected to the shaping circuit. Moreover, a feedback loop included in the logic circuit is not desirable, because, in general, such inclusion can make it difficult to perform a logic synthesis where the entire circuitry is integrated onto a single integrated circuit (IC).

Another drawback is that the conventional wave shaping circuit cannot properly remove chattering components resulting from switching noise where the PWM signal has an extremely low or extremely high duty cycle. Not surprisingly, failure to properly remove undesired noise may cause errors and variations in the duty cycle of the resulting PWM output.

BRIEF SUMMARY

This patent specification describes a novel pulse width modulation signal generator that includes a triangular wave generator, a voltage comparator, and a wave shaping circuit. The triangular wave generator generates a triangular wave signal and a pair of first and second pulse signals. The first pulse signal is pulsed for a given duration of time when the triangular wave signal reaches a minimum limit thereof. The second pulse signal is pulsed for a given duration of time when the triangular wave signal reaches a maximum limit thereof. The voltage comparator is connected to the triangular wave generator to generate a first pulse width modulation signal by comparing the triangular wave signal with an externally supplied direct current signal. The wave shaping circuit is connected to the triangular wave generator and the voltage comparator to generate a second pulse width modulation signal by removing chattering components occurring immediately after rising and falling edges of the first pulse width modulation signal with a masking signal generated based on the first and second pulse signals and the first pulse width modulation signal.

This patent specification further describes a novel pulse width modulation signal generation method that includes the steps of triangular wave signal generation, pulse signal generation, first pulse width modulation signal generation, and second pulse width modulation signal generation. The triangular wave signal generation generates a triangular wave signal. The pulse signal generation generates a pair of first and second pulse signals. The first pulse signal is pulsed for a given duration of time when the triangular wave signal reaches a minimum limit thereof. The second pulse signal is pulsed for a given duration of time when the triangular wave signal reaches a maximum limit thereof. The first pulse width modulation signal generation generates a first pulse width modulation signal by comparing the triangular wave signal with an externally supplied direct current signal. The second pulse width modulation signal generation generates a second pulse width modulation signal by removing chattering components occurring immediately after rising and falling edges of the first pulse width modulation signal with a masking signal generated based on the first and second pulse signals and the first pulse width modulation signal.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF PREFERRED EMBODIMENTS

Figure 1:
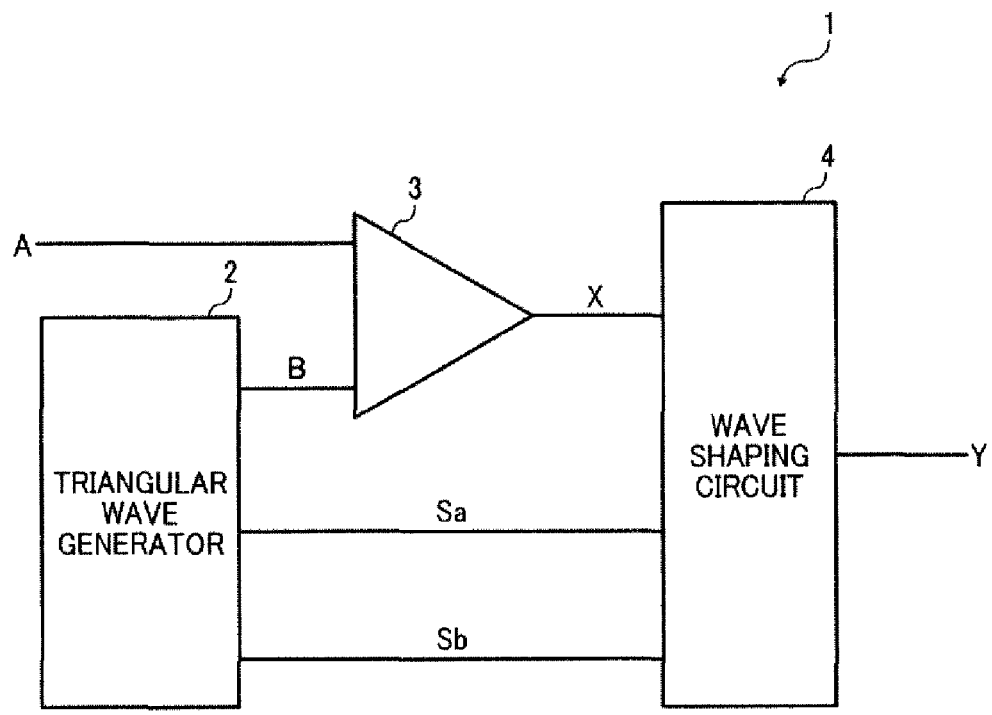
FIG. 1 is a block diagram of a pulse width modulation (PWM) signal generator according to an illustrative embodiment of this patent specification.

In describing exemplary embodiments illustrated in the drawings, specific terminology is employed for the sake of clarity. However, the disclosure of this patent specification is not intended to be limited to the specific terminology so selected, and it is to be understood that each specific element includes all technical equivalents that operate in a similar manner and achieve a similar result.

Referring now to the drawings, wherein like reference numerals designate identical or corresponding parts throughout the several views, exemplary embodiments of the present patent application are described.

FIG. 1 is a block diagram of a pulse width modulation (PWM) signal generator 1 according to an illustrative embodiment of this patent specification.

As shown in FIG. 1, the PWM signal generator 1 includes a triangular wave generator 2; a voltage comparator 3 connected to the triangular wave generator 2 and an external direct current (DC) source; and a wave shaping circuit 4 connected to the triangular wave generator 2 and the voltage comparator 3.

In the PWM signal generator 1, the triangular wave generator 2 generates a triangular wave B for output to the voltage comparator 3. The triangular wave generator 2 also outputs a first one-shot pulse signal Sa of a predetermined width when the triangular wave B reaches a given minimum voltage, and a second one-shot pulse signal Sb of a predetermined width when the triangular wave B reaches a given maximum voltage. The one-shot pulse signals Sa and Sb may be generated, for example, according to a result of comparing the triangular wave B with a DC voltage defining the minimum and maximum limits, respectively, of the triangular wave signal.

Figure 3:
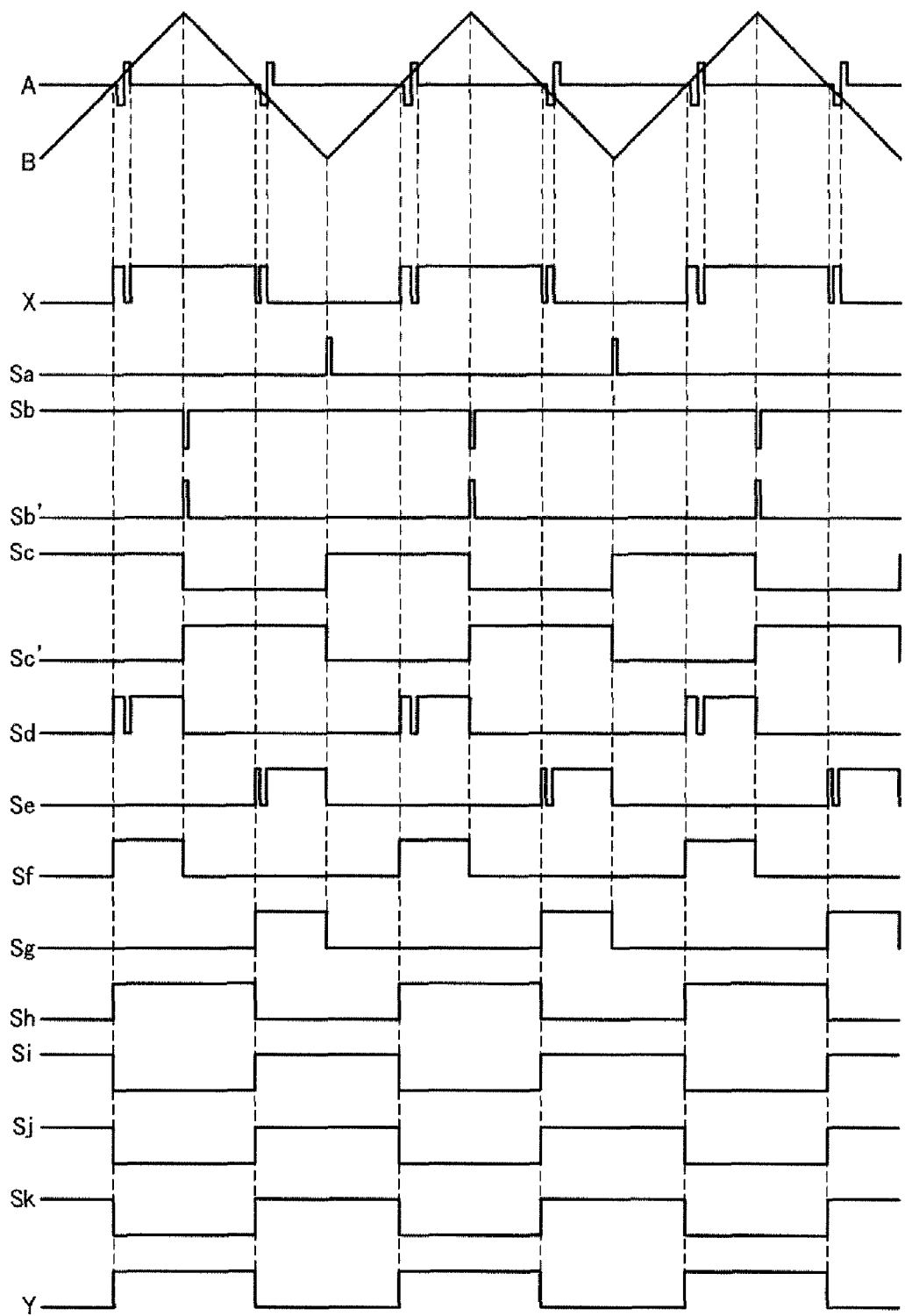
FIG. 3 is a timing chart illustrating an exemplary operation of the wave shaping circuit of FIG. 2.

With additional reference to FIG. 3, the one-shot pulse signals Sa and Sb are shown with the triangular wave signal B. Note that the signals Sa and Sb, indicating when the triangular wave B reaches its minimum and maximum limits, respectively, each is pulsed for a duration of time shorter than a period of time during which the triangular wave B goes from one limit to the other. That is, the pulse width of the signal Sa is shorter than a period of time during which the triangular wave B goes from its minimum limit to maximum limit, whereas the pulse width of the signal Sb is shorter than a period of time during which the triangular wave B goes from its maximum limit to minimum limit. In the present embodiment, the second one-shot pulse signal Sb is a negative pulse signal that normally remains high and goes low when pulsed for the predetermined time duration.

The voltage comparator 3 receives a DC voltage signal A from the external signal source, and the triangular signal B from the triangular wave generator 2. The voltage comparator 3 compares the input signals A and B against each other to output a PWM signal X based on the comparison result.

The wave shaping circuit 4 receives the PWM signal X from the voltage comparator 3, and the one-shot pulse signals Sa and Sb from the triangular wave generator 2. The wave shaping circuit 4 generates a desired, chatter-free PWM signal Y as an output of the PWM signal generator 1, by processing the original PWM signal X through masking circuitry that operates based on the one-shot pulse signals Sa and Sb to remove chattering or any unwanted signal components resulting from switching noise.

Figure 2:
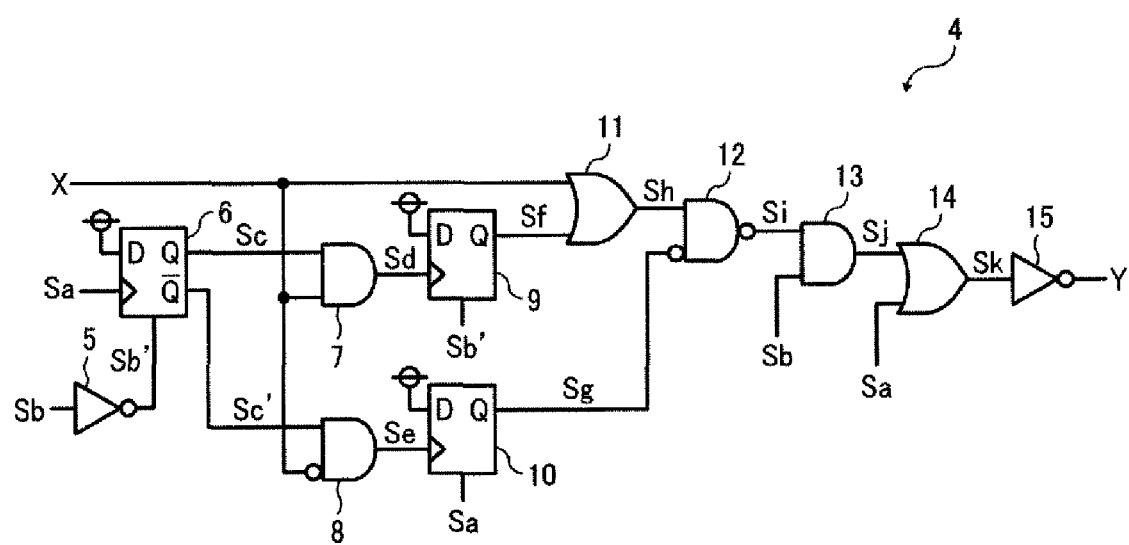
FIG. 2 is a circuit diagram of a wave shaping circuit included in the PWM signal generator of FIG. 1.

FIG. 2 is a circuit diagram showing the wave shaping circuit 2 included in the PWM signal generator 1 of FIG. 1. As shown in FIG. 2, the wave shaping circuit 4 includes masking circuitry formed of inverters 5 and 15; D-type flip-flops (DFFs) 6, 9, and 10; logic AND gates 7, 8, and 13; logic OR gates 11 and 14; and a logic NAND gate 12.

In the wave shaping circuit 2, the inverter 5 receives the one-shot pulse signal Sb from the triangular wave generator 2, and performs logical negation or NOT operation to output a resulting inverted pulse signal Sb' to the DFF 6.

The DFF 6 has its D input supplied with a constant, high level signal, clock terminal supplied with the one-shot pulse signal Sa from the triangular wave generator 2, and reset terminal supplied with the inverted pulse signal Sb', so as to output a pair of complementary signals Sc and Sc' at its Q and Q-bar outputs.

Accordingly, the Q and Q-bar outputs Sc and Sc' of the DFF 6 are clocked by the signal Sa (i.e. the one-shot pulse signal indicating when the triangular wave signal B reaches the minimum limit) and reset by the signal Sb' (i.e., the inverse of the one-shot pulse signal indicating when the triangular wave signal B reaches the maximum limit). The signal Sc thus generated remains logic high when the triangular wave signal B rises from its minimum to maximum limit, whereas the complementary signal Sc' remains logic high when the triangular wave signal B falls from its maximum to minimum limit (see, for example, FIG. 3).

The AND gate 7 receives the PWM signal X from the voltage comparator 3 and the output signal Sc from the DFF 6, and performs logical conjunction or AND operation to output a resulting signal Sd to the DFF 9. The AND gate 8 receives a logical inverse of the PWM signal X from the voltage comparator 3 and the signal Sc' from the DFF 6, and performs logical conjunction or AND operation to output a resulting signal Se to the DFF 10. The signals Sd and Se thus generated based on the complementary signals Sc and Sc', respectively, are asynchronous, that is, do not intersect or cross each other (see, for example, FIG. 3).

The DFF 9 has its D input supplied with a constant, high level signal, clock terminal supplied with the signal Sd from the AND gate 7, and reset terminal supplied with the inverted pulse signal Sb', so as to output a signal Sf at its Q output. The DFF 10 has its D input supplied with a constant, high level signal, clock terminal supplied with the signal Se from the AND gate 8, and reset terminal supplied with the pulse signal Sa, so as to output a signal Sg at its Q output.

The OR gate 11 receives the PWM signal X from the voltage comparator 3 and the signal Sf from the DFF 9, and performs logical disjunction or OR operation to output a resulting signal Sh to the NAND gate 12. The NAND gate 12 receives the signal Sh from the OR gate 11 and a logical inverse of the signal Sg from the DFF 10, and performs logical non-conjunction or NAND operation to output a resulting signal Si to the AND gate 13. The signal Si thus generated represents a masked, chatter-free PWM signal, obtained by removing chatter components from the original PWM signal X.

Accordingly, the signals Sf and Sg generated based on the one-pulse signals Sa and Sb as well as the PWM signal X serve as masking signals applied to the PWM signal X to eliminate chattering components from the resulting output signal Y. That is, the signal Sf, which is forced to logic high immediately after the PWM signal X goes high from low, is applied through the OR gate 11 to mask and remove noise included in the PWM signal X. On the other hand, the signal Sg, which is forced to logic high immediately after the PWM signal X goes low from high, is applied through the NAND gate 12 to cause its logical inverse to mask and remove noise included in the PWM signal X.

The AND gate 13 receives the signal Si from the NAND gate 12 and the one-shot pulse signal Sb from the triangular wave generator 2, and performs logical conjunction or AND operation to output a resulting signal Sj to the OR gate 14. The OR gate 14 receives the signal Sj from the AND gate 13 and the one-shot pulse signal Sa from the triangular wave generator 2, and performs logical disjunction or OR operation to output a resulting signal Sk to the inverter 15. The inverter 15 receives the signal Sk from the OR gate 14, and performs logical negation or NOT operation to output a resulting signal Y at its output, which constitutes the output of the PWM signal generator 1.

Provision of the logic gates 13, 14, and 15 downstream of the AND gate 12 enables the PWM signal generator 1 to obtain a desired, noise-free PWM signal even where masking with the signals Sf and Sg does not work effectively due to an extremely high or extremely low duty cycle specified for the PWM signal.

Referring to FIG. 3, which shows examples of the PWM signals X and Y, the one-shot pulse signals Sa and Sb, and the other, internal signals Sc through Sk of the wave shaping circuit 4 described above, an exemplary operation of the PWM signal generator 1 is described in detail.

As shown in FIG. 3, an original PWM signal X contains chattering components immediately after its rising and falling edges, which are produced due to switching noise appearing in a DC voltage signal A immediately after the signal A crosses a triangular wave signal B. A pair of first and second, one-shot pulse signals Sa and Sb is generated by the triangular wave generator 2, the former remaining logic high for a given duration of time immediately after the triangular wave signal B reaches the minimum limit, and the latter (or its inverse) remaining logic high for a given duration of time immediately after the triangular wave signal B reaches the maximum limit.

The wave shaping circuit 4 prevents noise from propagating to the output PWM signal Y by processing the original signal X through a series of masking processes.

Specifically, based on the pulse signals Sa and Sb supplied from the triangular wave generator 2, the wave shaping circuit 4 generates a signal Sc that remains logic high when the triangular wave signal B rises from its minimum to maximum limit, and a complementary signal Sc' that remains logic high when the triangular wave signal B falls from its maximum to minimum limit, so as to create a pair of signals Sd and Se that do not intersect each other.

With the asynchronous signals Sd and Se thus obtained, the wave shaping circuit 4 then generates a masking signal Sf through the DFF 9, which latches an initial positive rising edge of the PWM signal X and subsequently resets it with the one-shot pulse signal Sb', and a masking signal Sg through the DFF 10, which latches an initial negative rising edge of the PWM signal X and subsequently resets it with the one-shot pulse signal Sa.

The wave shaping circuit 4 then applies the masking signal Sf to the original PWM signal X to mask noise at the rising edge to obtain a signal Sh, and further applies the masking signal Sg to mask noise at the falling edge to obtain a signal Si. The resulting signal Si is forwarded through the downstream circuit composed of the logic gates 13, 14, and 15 to obtain a finalized PWM output signal Y.

Figure 4:
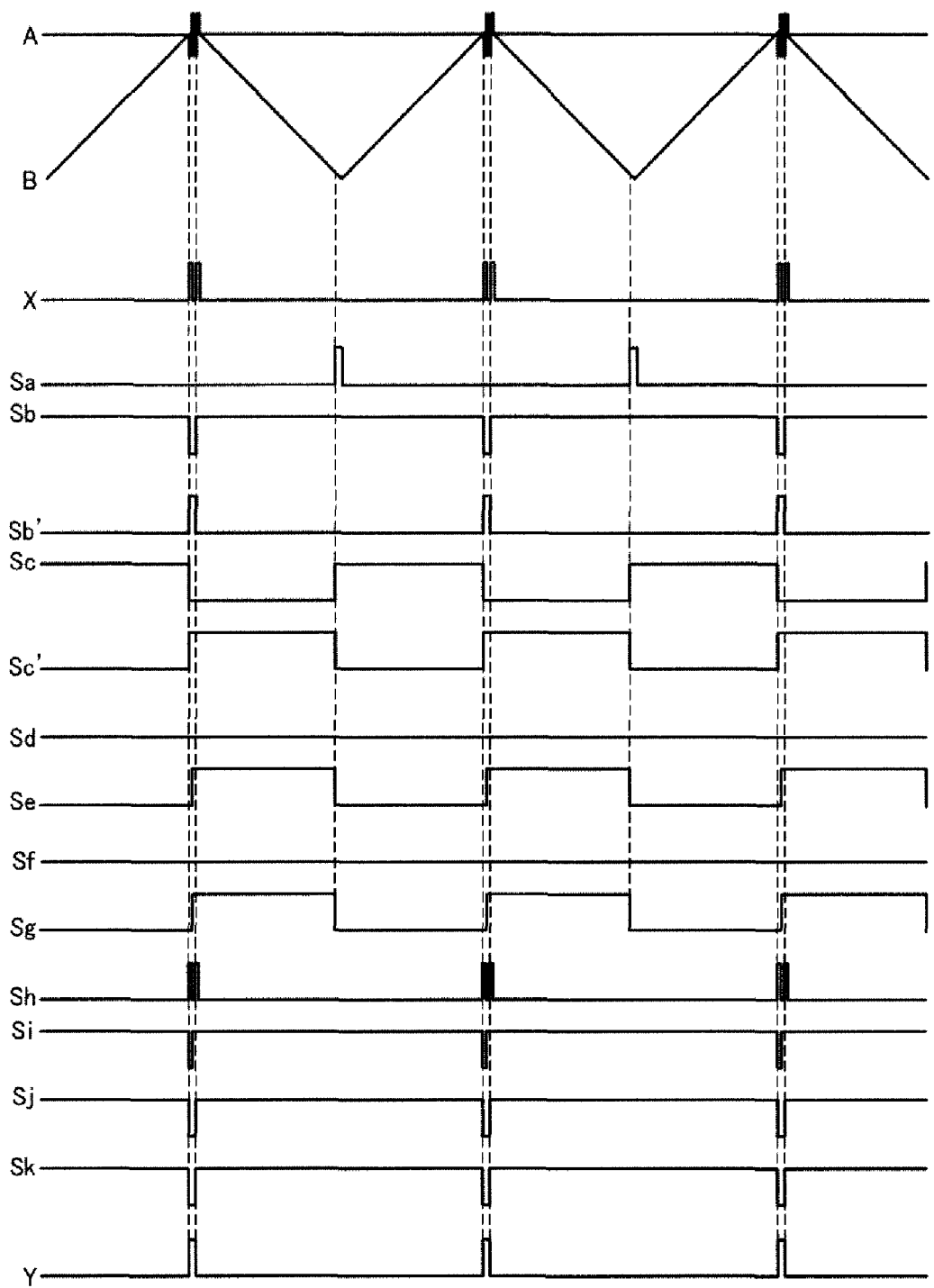
FIG. 4 is a timing chart illustrating another exemplary operation of the wave shaping circuit of FIG. 2, wherein the PWM signal has an extremely low duty cycle.

Referring to FIG. 4, which shows another example of the PWM signals X and Y, the one-shot pulse signals Sa and Sb, and the other, internal signals Sc through Sk of the wave shaping circuit 4 described above, an exemplary operation of the PWM signal generator 1 is described in detail in which the PWM signal has an extremely low duty cycle.

As shown in FIG. 4, where the duty cycle is extremely low, the chattering components occurring at the rising and falling edges of the PWM signal X can coalesce into a single continuous component that appears where the triangular wave signal B reaches its maximum, resulting in noise spanning almost the entire duty cycle of the PWM signal X.

In such cases, the wave shaping circuit 4 does not trigger the signal Sd to cause the masking signal Sf to go logic high, and therefore fails to mask the incoming PWM signal before the triangular wave signal B reaches the maximum limit following the rising edge of the original PWM signal. If not corrected, failure to mask the original PWM signal would result in faulty operation of load circuitry due to chattering components remaining in the resulting PWM signal.

In the wave shaping circuit 4, however, provision of the logic gate circuitry downstream of the NAND gate 12 effectively compensates for failure where the masking signal does not work properly. That is, the AND gate 13 performs logical AND operation between the NAND gate output Si and the one-shot pulse signal Sb, which is pulsed whenever the triangular wave signal B reaches the maximum limit, so that the resulting PWM signal Y exhibits a pulse width identical to that of the signal Sb (or its inverse Sb') even where the masking signal Sf is not triggered due to an extremely low duty cycle. That is, the wave shaping circuit 4 outputs the one-shot pulse signal Sb input from the triangular wave generator 2 as the PWM signal Y.

Further, the OR gate 14 performs logical OR operation between the AND gate output Sj and the one-shot pulse signal Sa, which is pulsed whenever the triangular wave signal B reaches the minimum limit, so that the resulting PWM signal Y exhibits a pulse width identical to that of the signal Sa even where the masking signal is not triggered due to an extremely high duty cycle. That is, the wave shaping circuit 4 outputs the one-shot pulse signal Sa input from the triangular wave generator 2 as the PWM signal Y.

Hence, the PWM signal generator 1 according to this patent specification can generate a PWM signal without chattering due to switching noise, wherein the wave shaping circuit 4 generates the masking signals Sf and Sg based on the one-shot pulse signals Sa and Sb output from the triangular wave generator 2 as well as the original PWM signal X output from the voltage comparator 3, which can mask or remove chattering components occurring immediately after the rising and falling edges of the original signal X to obtain the noise-free, finalized PWM signal Y. Such wave shaping circuit 4 can provide a desired initial output upon activation, since it involves no feedback loop that would adversely affect operation of the logic circuit.

Moreover, the PWM signal generator 1 can output a desired output signal regardless of whether the PWM signal has an extremely low or extremely high duty cycle specified, wherein the wave shaping circuit 4 can output the one-shot pulse signal Sa or Sb input from the triangular wave generator 2 as the finalized PWM signal Y where the masking signal Sf or Sg does not properly mask the original PWM signal.

In a further embodiment, the voltage comparator 3 may be configured as a hysteresis comparator. Using such voltage comparator ensures high reliability of the entire generator circuitry, wherein the hysteresis comparator can provide its output signal with high immunity to errors caused by switching noise whose range is smaller than the hysteresis width.

Numerous additional modifications and variations are possible in light of the above teachings. It is therefore to be understood that, within the scope of the appended claims, the disclosure of this patent specification may be practiced otherwise than as specifically described herein.

This patent specification is based on Japanese Patent Application No. 2010-056918 filed on Mar. 15, 2010 in the Japanese Patent Office, the entire contents of which are incorporated by reference herein.

What is claimed is:

1. A pulse width modulation signal generator comprising:
a triangular wave generator to generate a triangular wave signal and a pair of first and second pulse signals,
the first pulse signal being pulsed for a first duration of time when the triangular wave signal reaches a minimum limit thereof,
the second pulse signal being pulsed for a second duration of time when the triangular wave signal reaches a maximum limit thereof;
a voltage comparator connected to the triangular wave generator to generate a first pulse width modulation signal by comparing the triangular wave signal with a direct current signal supplied from a signal source external to the pulse width modulation signal generator; and
a wave shaping circuit connected to the triangular wave generator and the voltage comparator to generate a second pulse width modulation signal by removing chattering components occurring immediately after at least one of a rising edge and a falling edge of the first pulse width modulation signal with a first masking signal generated based on the first and second pulse signals and the first pulse width modulation signal, wherein the wave shaping circuit outputs either one of the first and second pulse signals as the second pulse width modulation signal where the masking signal is not triggered.

2. The pulse width modulation signal generator according to claim 1, wherein the voltage comparator comprises a hysteresis comparator.

3. The pulse width modulation signal generator according to claim 1, wherein the wave shaping circuit removes, during generation of the second pulse width modulation signal, chattering components occurring immediately after a first edge among the rising edge and the falling edge of the first pulse width modulation signal with the first masking signal generated based on the first and second pulse signals and the first pulse width modulation signal.

4. The pulse width modulation signal generator according to claim 3, wherein the wave shaping circuit further removes, during generation of the second pulse width modulation signal, chattering components occurring immediately after a second edge that is different from, and consecutive to, the first edge of the first pulse width modulation signal with a second masking signal generated based on the first and second pulse signals and the first pulse width modulation signal.

5. The pulse width modulation signal generator according to claim 3, wherein the first edge of the first pulse width modulation signal is a rising edge.

6. The pulse width modulation signal generator according to claim 3, wherein the first edge of the first pulse width modulation signal is a falling edge.

7. The pulse width modulation signal generator according to claim 1, wherein the wave shaping circuit removes, during generation of the second pulse width modulation signal, chattering components occurring immediately after the rising edge of the first pulse width modulation signal with the first masking signal generated based on the first and second pulse signals and the first pulse width modulation signal.

8. The pulse width modulation signal generator according to claim 1, wherein the wave shaping circuit removes, during generation of the second pulse width modulation signal, chattering components occurring immediately after the falling edge of the first pulse width modulation signal with the first masking signal generated based on the first and second pulse signals and the first pulse width modulation signal.

9. The pulse width modulation signal generator according to claim 1, wherein the wave shaping circuit performs a logical operation based on the first pulse width modulation signal and the first masking signal.

10. A pulse width modulation signal generation method comprising the steps of:
   generating a triangular wave signal;
   generating a pair of first and second pulse signals,
   the first pulse signal being pulsed for a first duration of time when the triangular wave signal reaches a minimum limit thereof,
   the second pulse signal being pulsed for a second duration of time when the triangular wave signal reaches a maximum limit thereof;
   generating a first pulse width modulation signal by comparing the triangular wave signal with a direct current signal; and
   generating a second pulse width modulation signal by removing chattering components occurring immediately after at least one of a rising edge and a falling edge of the first pulse width modulation signal with a first masking signal generated based on the first and second pulse signals and the first pulse width modulation signal,
   wherein the second pulse width modulation signal generation step outputs either one of the first and second pulse signals as the second pulse width modulation signal where the masking signal is not triggered.

* * * * *